United States Patent
Kelaher et al.

(10) Patent No.: US 8,879,252 B2
(45) Date of Patent: Nov. 4, 2014

(54) ADAPTIVE COOLING DEVICE POSITIONING FOR ELECTRONIC COMPONENTS

(71) Applicant: International Business Machines Corporation, Armonk, NY (US)

(72) Inventors: Daniel P Kelaher, Research Triangle Park, NC (US); William M. Megarity, Research Triangle Park, NC (US); John P Scavuzzo, Research Triangle Park, NC (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 13/667,834

(22) Filed: Nov. 2, 2012

(65) Prior Publication Data
US 2014/0124169 A1 May 8, 2014

(51) Int. Cl.
*H05K 7/20* (2006.01)
*F28F 9/00* (2006.01)
*H05K 5/00* (2006.01)
*F01D 25/24* (2006.01)

(52) U.S. Cl.
CPC ............................. *F28F 9/00* (2013.01)
USPC ............................. 361/695; 454/185; 415/126

(58) Field of Classification Search
CPC ............ G06F 1/16–1/1654; G06F 1/656; G06F 1/662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ....................... 361/679.46–679.54, 688–723; 165/80.1–80.5, 104.33, 185; 174/15.1–15.2, 16.1–16.3, 521, 526, 174/547–548; 454/184; 257/718–719
See application file for complete search history.

(56) References Cited

U.S. PATENT DOCUMENTS 5,562,410 A 10/1996 Sachs et al.
5,949,646 A 9/1999 Lee et al.
(Continued)

OTHER PUBLICATIONS

Coteus et al., "Packaging the Blue Gene/L supercomputer", IBM Journal of Research & Development, Mar./May 2005, pp. 213-248, vol. 49, No. 2/3, (Accepted Jul. 26, 200. Online publication Mar. 23, 2005), Riverton, NJ, USA. Copyright © 2005 International Business Machines Corporation.

*Primary Examiner* — Zachary M Pape
*Assistant Examiner* — Razmeen Gafur
(74) *Attorney, Agent, or Firm* — Kevin D. Kehe; Jennifer M. Anda

(57) ABSTRACT

A method and apparatus of cooling electronic components when replacing a cooling device in an information technology system are disclosed. The apparatus may include first and second cooling device trays that may be slidably mounted within an information technology system. The cooling device trays may include one or more cooling devices that are movably mounted to the cooling device trays. The apparatus may pivot one or more of the cooling devices when a pivot member contacts a fixed member with the chassis.

20 Claims, 6 Drawing Sheets

(56) References Cited

U.S. PATENT DOCUMENTS

| | | | |
|---|---|---|---|
| 6,186,889 B1* | 2/2001 | Byrne ......................... 454/184 |
| 6,388,880 B1 | 5/2002 | El-Ghobashy et al. |
| 6,549,406 B1 | 4/2003 | Olesiewicz et al. |
| 6,648,947 B2 | 11/2003 | Paydar et al. |
| 7,017,059 B2 | 3/2006 | Law et al. |
| 7,298,612 B2* | 11/2007 | Malone ................... 361/679.33 |
| 7,408,774 B1* | 8/2008 | Anderl et al. ................ 361/695 |
| 7,518,865 B2 | 4/2009 | Anderl et al. |
| 7,733,649 B2* | 6/2010 | Anderl et al. ................. 361/695 |
| 8,057,082 B2* | 11/2011 | Seabrook ..................... 362/547 |
| 8,120,910 B2* | 2/2012 | Hong .......................... 361/695 |
| 2004/0211553 A1* | 10/2004 | Hancock ...................... 165/260 |
| 2006/0084374 A1* | 4/2006 | Cruz et al. ................... 454/184 |
| 2007/0201210 A1* | 8/2007 | Chow et al. .................. 361/704 |
| 2011/0245976 A1* | 10/2011 | Thompson et al. ........... 700/275 |
| 2011/0273835 A1 | 11/2011 | Katakura et al. |
| 2012/0133255 A1 | 5/2012 | Izuno et al. |

\* cited by examiner

ADAPTIVE COOLING DEVICE POSITIONING FOR ELECTRONIC COMPONENTS

FIELD

The present disclosure generally relates to cooling systems for electronics, and in particular, to a cooling system that redirects a fluid flow when removing and replacing a cooling device.

BACKGROUND

Information technology systems (e.g., servers, storage systems, switches, etc.) generate large amounts of heat during operation. This heat must be removed from these systems in order to maintain safe operating temperatures. The components within an overheated system generally exhibit a shorter maximum lifespan and may give sporadic problems. Cooling of these systems is typically accomplished by way of forced convection cooling. In these systems, cooling fans are used to force air to flow over the heat generating devices.

An individual cooling device may not be sufficient to supply the cooling needs of a whole system. In such a situation, multiple cooling devices may operate simultaneously to provide sufficient cooling of the system. In some cases, more fans than are necessary may be used, a technique known as redundant cooling. When multiple cooling fans are used, even in cases where there is no cooling redundancy, a single cooling fan may fail, but the others may continue operating in order to prevent overheating. The system may increase the output of the remaining cooling fans to compensate for the failed cooling fan and to notify an operator that a cooling device unit has failed.

SUMMARY

Embodiments of the disclosure provide a method and apparatus for redirecting fluid flow when a cooling device is removed from an information technology system. The method and apparatus may allow an information technology system to continue to operate during removal and replacement of the cooling device.

One embodiment is directed to an apparatus for redirecting fluid flow when removing a cooling device from an information technology system containing electronic components. The apparatus may include a first and a second cooling device tray that may be slidably mounted within an information technology system. The cooling device trays may include one or more cooling devices that are movably mounted to the cooling device tray. The apparatus may pivot one or more of the cooling devices when a pivot member contacts a fixed member within the chassis.

Another embodiment is directed to a method for redirecting fluid flow when removing a cooling device from an information technology system containing electronic components. The method may include moving a cooling device tray in response to movement of another cooling device tray. The method may also provide for rotation of one or more cooling devices that are movably mounted to the cooling device tray. Further, the method may provide for the rotation back to a normal operating configuration of the one or more cooling devices when the cooling device tray is returned to its normal operating position.

BRIEF DESCRIPTION OF THE DRAWINGS

Like reference numbers and designations in the various drawings indicate like elements.

DETAILED DESCRIPTION

Cooling devices within an information technology system may require replacement. This may be done, for example, when a cooling device fails. Even under failure conditions, it may be impractical to shut down the system in order to swap the failed cooling device. In many settings, therefore, it may be necessary to swap a cooling device while the system is running, known as hot swapping. The remaining operational cooling devices must therefore continue to cool the system while hot swapping the cooling device. Cooling of the system may be better maintained by allocating fluid flow from the remaining cooling device or devices across the area that was previously cooled by the cooling device being removed and replaced.

Embodiments disclosed herein are directed to a method and apparatus that enhances the ability of a cooling system to maintain a safe operating temperature for electronic components within an information technology system. An information technology system may, for example, include a server, a storage system, or switches. To simplify the present description and the claims, "chassis" will be used to include the various types of information technology systems. In one embodiment, a first cooling device tray that includes one or more cooling devices may cause a second cooling device tray to move when the first cooling device tray is slid toward the outside of a chassis. The movement of the second cooling device tray may pivot one or more cooling devices. The rotation may distribute the fluid flow of the cooling device over electronic components, preventing overheating of the components when one of the cooling device trays is removed from the chassis. The modification of the fluid flow may also allow an operator to hot-swap a cooling device.

Figure 1:
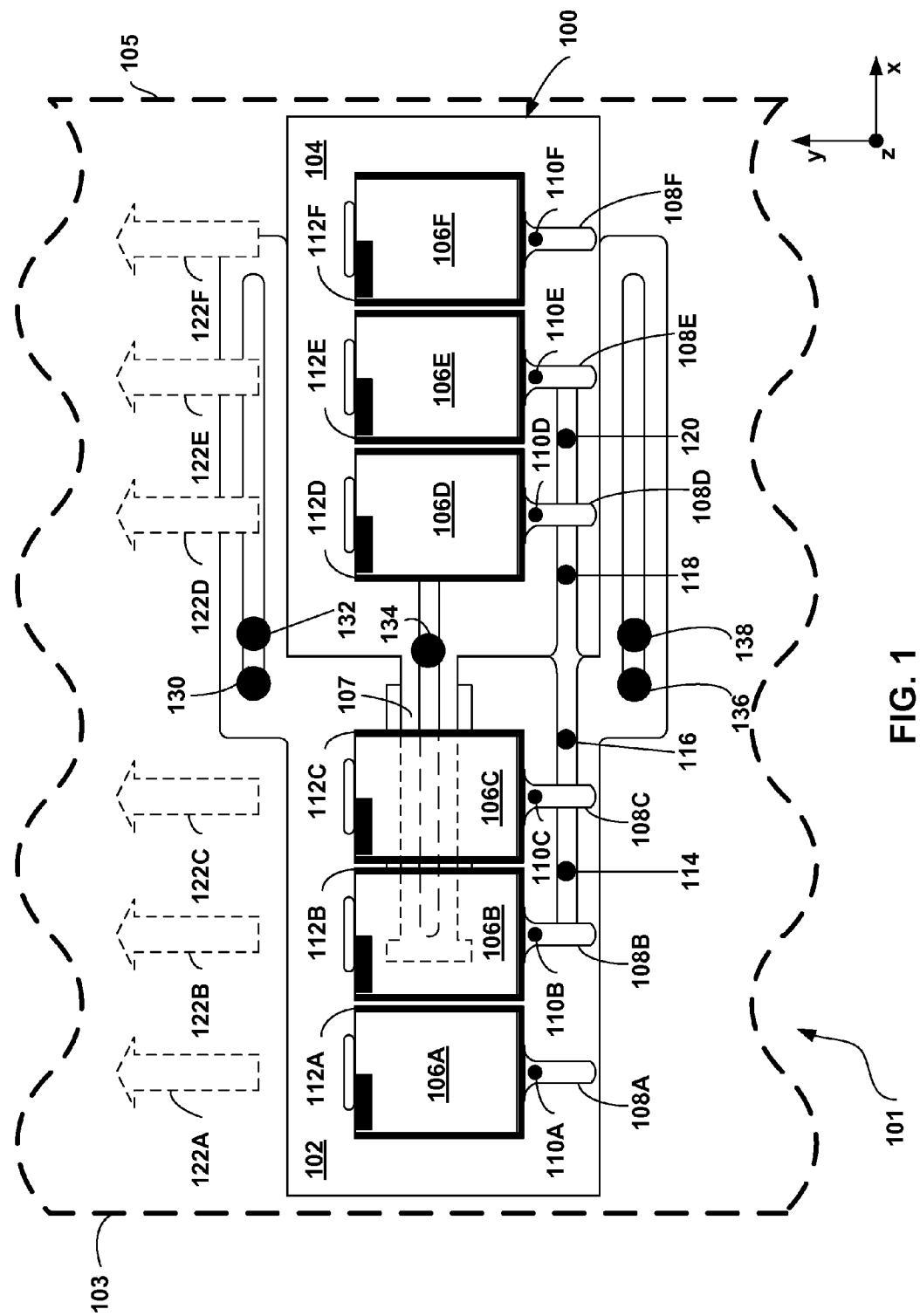
FIG. 1 illustrates a top view of an installed cooling apparatus under normal operating conditions, according to some embodiments.

FIG. 1 illustrates a cooling apparatus 100 for cooling electronic equipment in a normal operating configuration, according to some embodiments. Cooling apparatus 100 may be located within a chassis, e.g., chassis 101. A chassis 101 may contain any type of electrical component (not depicted in FIG. 1), such as memory modules, processors, power supplies, etc. The memory may, for example, be a single inline memory module (SIMM) or a dual inline memory module (DIMM). The processors may, for example, be central processing units (CPUs) or digital signal processors (DSPs). The chassis 101 may also include heat sinks for dissipating heat from the electronic components. In some embodiments, cooling apparatus 100 may cool both the heat sinks and the electronic components.

Cooling apparatus 100 may include cooling device trays 102 and 104, which may be slidably mounted in the chassis 101 and may be capable of insertion and removal through a side 103, 105 of the chassis 101, according to some embodiments. Cooling device trays 102 and 104 may be inserted and removed through a side 103, 105 of the chassis 101. Removal may be from a side 103 or 105 because other components may prevent removal from the top, front, or back of the chassis 101. Cooling device trays 102 and 104 may be mechanically linked together. In some embodiments, a linkage 107 may be a part of either cooling device tray 102 or cooling device tray 104. In other embodiments, the linkage 107 may be a separate piece that is attached to one of the cooling device trays 102, 104. The linkage 107 may allow for cooling device tray 102 to slide some distance before engaging the linkage 107 and sliding cooling device tray 104. Conversely, the linkage 107 may allow for cooling device tray 104 to slide some distance before engaging the linkage 107 and sliding cooling device tray 102. The distance may be dependent upon the width of the chassis 101. The distance may also be based on providing a cooling device configuration that enables fluid flow to be distributed across the electronic components when one of the cooling device trays has been removed from the chassis 101.

Cooling device trays 102 and 104 are both capable of being removed from the chassis 101. Cooling device tray 102 may be slid out side 103 of the chassis 101. Cooling device tray 104 may be slid out side 105 of the chassis 101. Cooling apparatus 100 may act similarly regardless of which cooling device tray is removed from the chassis 101. However, to simplify the present description and the claims, cooling device tray 102 will be treated as the cooling device tray that is being removed from the chassis 101.

Cooling device trays 102 and 104 may include a group of cooling devices 106A-106F, hereinafter referred to as cooling devices 106. Cooling devices 106 may exchange heated air or other fluid with cooler air or fluid. In some embodiments, a cooling device 106 may be a fan. To simplify this description and the claims and because there are various types of fans which may be suitable, cooling devices will be referred to generally herein. Cooling devices 106A-106C may be considered to be a cooling device pack, but may be able to be replaced individually. Cooling devices 106D-106F may also be considered to be a cooling device pack, but may also be able to be replaced individually. In some embodiments, cooling device trays 102 and 104 may hold cooling device packs that include fewer individual cooling devices than depicted in the figures. In other embodiments, cooling device trays 102 and 104 may hold cooling device packs that include more individual cooling devices than depicted in the figures.

Cooling devices 106 may be movably mounted (e.g., rotatable) to cooling device trays 102 and 104 in some embodiments. In other embodiments, cooling devices 106 may be inserted into cooling device cradles, e.g., cooling device cradles 112A-112F, hereinafter referred to as cooling device cradles 112. Cooling device cradles 112 may include pivot members, e.g., pivot members 108A-108F, hereinafter referred to as pivot members 108. In some embodiments, the pivot members 108 may be directly attached to cooling devices 106 instead of to cooling device cradles 112. However, for illustrative purposes the pivot members 108 are shown as being attached to the cooling device cradles 112. In some embodiments, the cooling device cradles 112 and the pivot members 108 may be a single piece of material. In other embodiments, the cooling device cradles 112 and the pivot members 108 may be an assembly.

Cooling device cradles 112 may be movably mounted (e.g., rotatable) to cooling device trays 102 and 104 in some embodiments. In these embodiments, pivot posts 110A-110F, hereinafter referred to as pivot posts 110, may be the pivot point for cooling device cradles 112. In other embodiments, pivot posts 110 may be the pivot point for the cooling devices 106. Pivot posts 110 may include a rotation mechanism. The rotation mechanism may maintain the cooling device cradles 112 in the normal operating configuration in some embodiments. In other embodiments, the rotation mechanism may return the cooling device cradles 112 to the normal operating configuration after rotation. A rotation mechanism, may, for example, include a spring. In other embodiments, a rotation mechanism may include a torsion bar. A torsion bar, as referred to herein, may include a bar that may twist when a force is applied and return to its normal configuration when the force is removed. Cooling devices 106 may be capable of rotating about the longitudinal axis of pivot posts 110, hereinafter referred to as the pivot axis. The pivot axis corresponds to the z-axis in the figures, which comes out of the page as shown. In some embodiments, rotation about the pivot axis may be a result of the pivot members 108 coming into contact with a fixed member, such as members 114-120. Members 114-120 may be cylindrical members with varied heights, which is further described in conjunction with FIG. 2 below. Members 114-120 may be fixed to chassis 101 in order to configure the chassis 101 for the cooling apparatus 100.

As shown in FIG. 1, when cooling apparatus 100 is installed in a chassis 101, cooling devices 106 may direct fluid streams 122A-122F, hereinafter referred to as fluid streams 122, in a direction that is perpendicular to cooling device trays 102 and 104, according to some embodiments. In some embodiments, fluid streams 122 may be parallel to the electronic components being cooled. In some embodiments a fluid stream may include an airflow. In the normal operating configuration, the fluid streams 122 may be distributed across the electronic components within the chassis 101 such that all of the electronic components within the chassis 101 are being cooled through convection.

As shown in FIG. 1, cooling apparatus 100 may be installed in the chassis with guides 130-138, according to some embodiments. Guides 130-138 may be affixed to the chassis 101 and provide a guide along which cooling devices 102 and 104 may slide. This may, for example, maintain the cooling device trays 102, 104 within the chassis 101. In some embodiments, an operator may swap the cooling devices 106 by sliding cooling device tray 102 out side 103, while cooling device tray 104 remains within the chassis 101. In other embodiments, an operator may swap the cooling devices 106 by sliding cooling device tray 104 out side 105, while cooling device tray 102 remains within the chassis 101.

Figure 2:
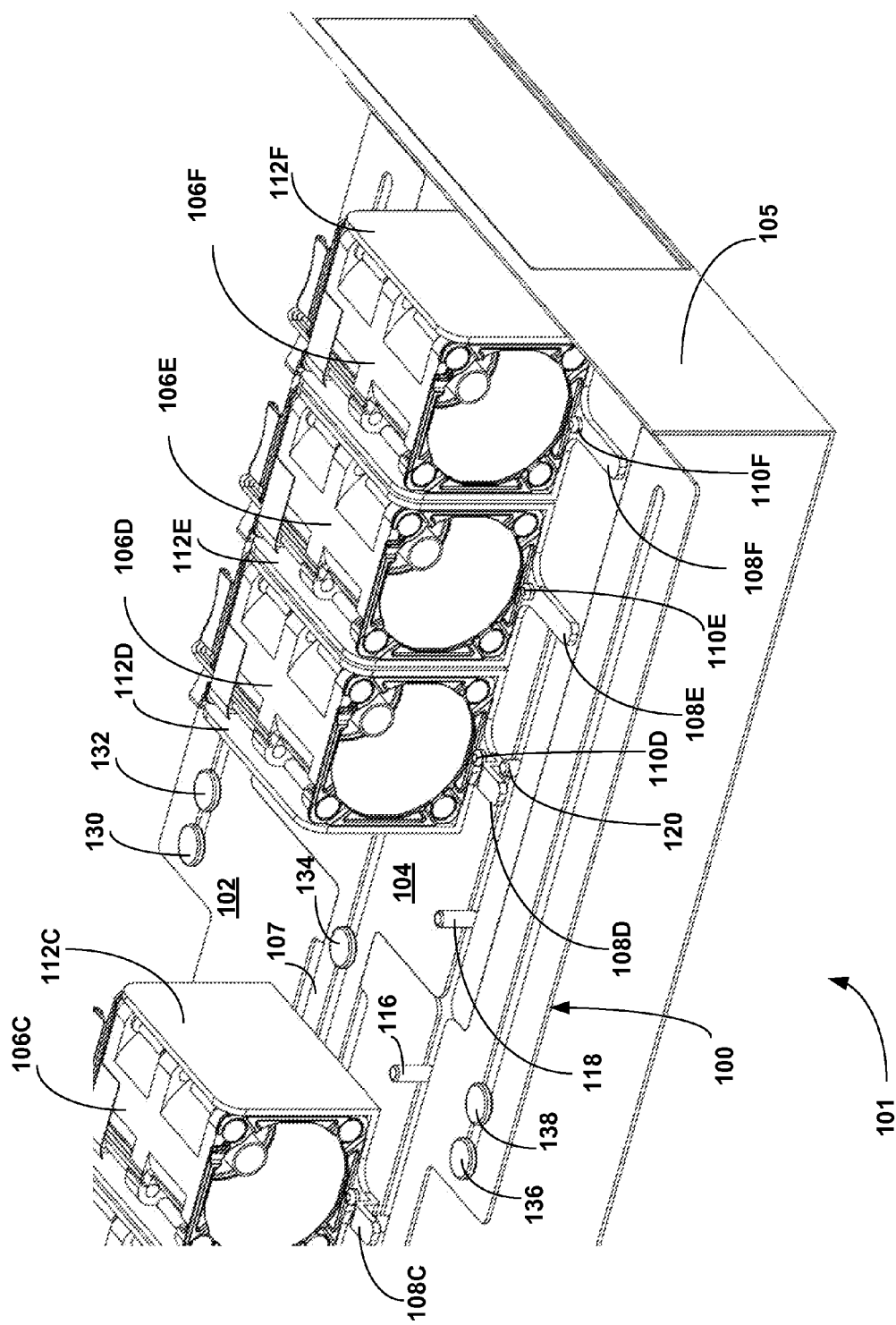
FIG. 2 illustrates an isometric view of the installed cooling apparatus under normal operating conditions, according to some embodiments.

FIG. 2 is an isometric view of cooling apparatus 100 in the normal operating configuration, according to some embodiments. As shown in FIG. 2, members 118 and 120 may be of varied heights in some embodiments. For simplification of this description and the claims, the view illustrates additional detail for cooling device tray 104. Cooling device tray 102 may be similarly configured in some embodiments. In addition to the members 114-120 being of varied heights, the pivot members 110 may be configured differently as well. For example, pivot member 110D may be configured such that it may pass unobstructed over member 120 when an operator slides cooling device tray 102 out the side 105 of the chassis 101. The height of pivot member 110D, however, may be such that the pivot member 110D comes into contact with member 118 when an operator is sliding cooling device tray 102 out a side, e.g., side 103, of the chassis 101. Pivot member 108E may be configured such that it comes into contact with member 120 when an operator is sliding cooling device tray 102 out a side, e.g., side 103, of the chassis 101.

Figure 3:
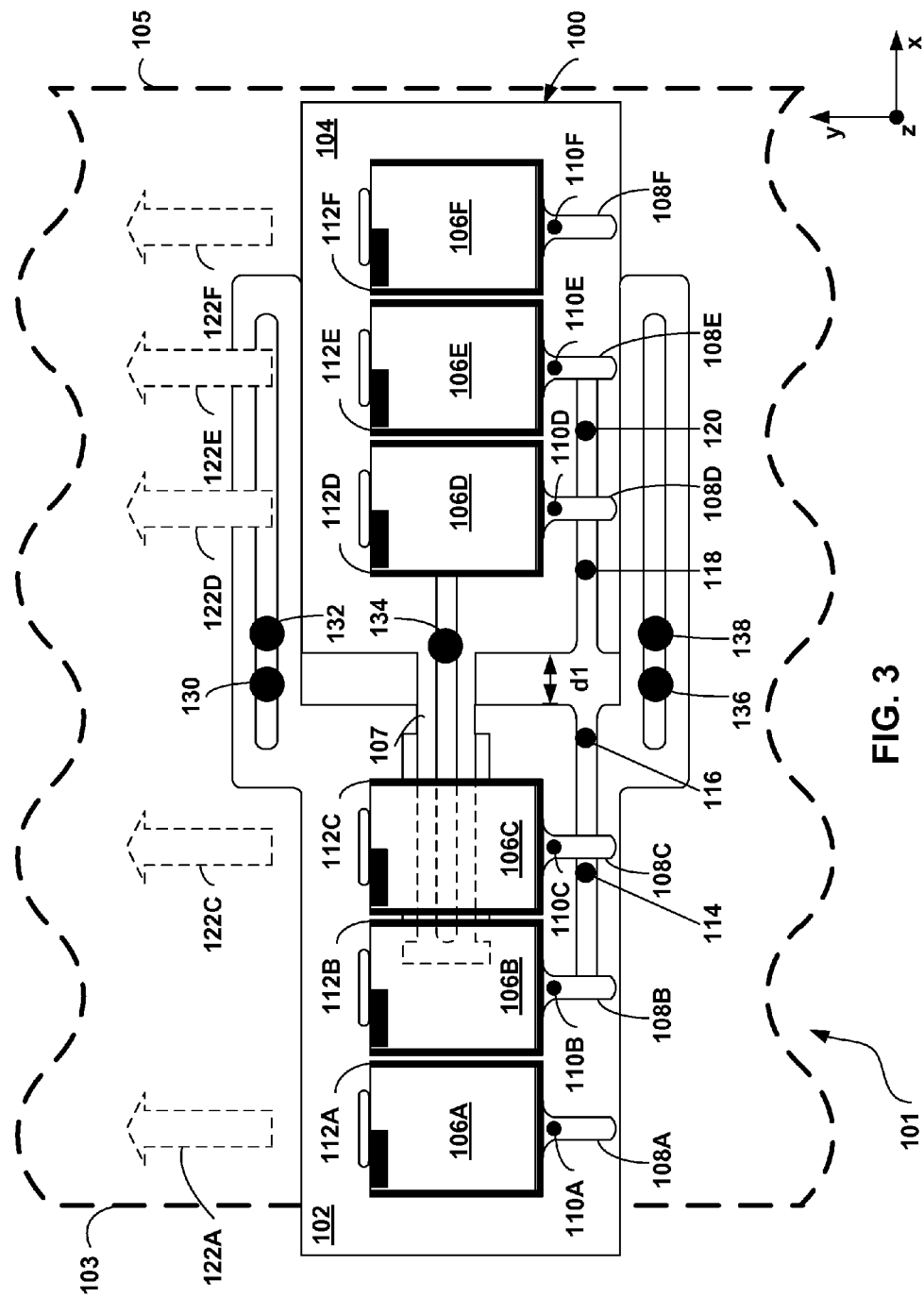
FIG. 3 illustrates a top view of an intermediate depiction of the installed cooling apparatus as one of the cooling device trays is slid out a side of an information technology system, according to some embodiments.

FIG. 3 illustrates cooling apparatus 100 when a cooling device, e.g., cooling device 106B, is being replaced, according to some embodiments. FIG. 3 is an intermediate depiction of the cooling apparatus as an operator is sliding cooling device tray 102 out side 103 to replace a cooling device, e.g., cooling device 106B (depicted without an airflow for illustrative purposes). A cooling device may, for example, be replaced when a failure occurs. The depiction at this intermediate stage may be the same if one or more of cooling devices 106A-106C fail. In the intermediate stage, cooling device tray 102 has begun to travel out the side 103 of the chassis 101. At this intermediate stage, however, the linkage 107 between cooling device trays 102 and 104 has not engaged and cooling device tray 104 is therefore depicted in its starting position. The distance d1 that cooling device tray 102 travels prior to engaging the linkage 107 with cooling device 104 may be dependent upon the size of the chassis 101. The distance d1 may be dependent on ensuring that cooling devices 106 cannot be replaced by an operator until cooling device tray 104 has been repositioned to provide cooling to the electronic components in the absence of cooling device tray 102.

Figure 4:
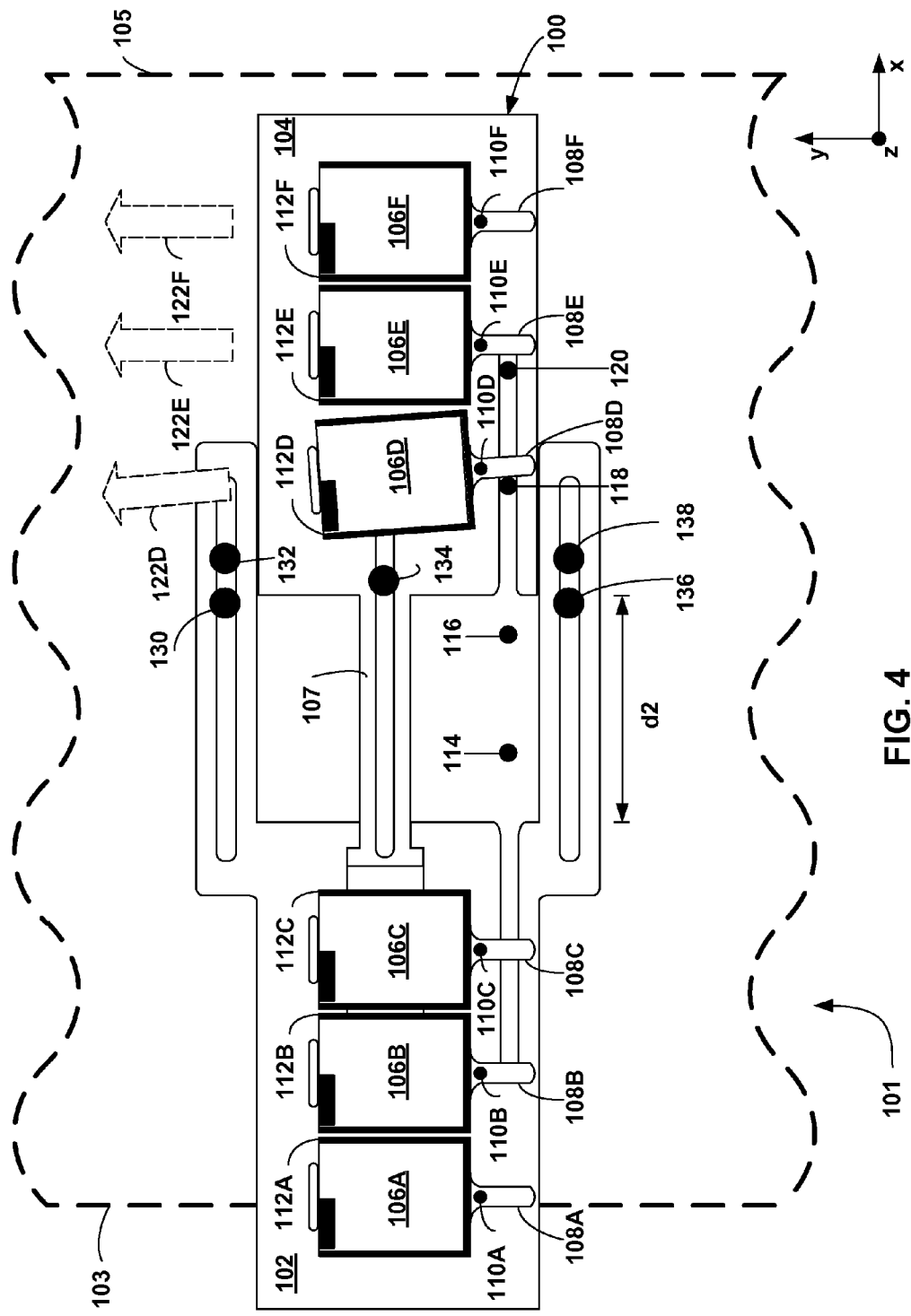
FIG. 4 illustrates a top view of the installed cooling apparatus when one of the cooling device trays is partially removed from an information technology system, with the remaining operational cooling devices partially rotated because of the cooling device tray motion, according to some embodiments.

FIG. 4 illustrates cooling apparatus 100 when a cooling device, e.g., cooling device 106B, is being replaced and an operator is in the process of removing cooling device tray 102 from the side 103 of the chassis 101. FIG. 4 is an intermediate depiction of the cooling apparatus as an operator is sliding cooling device tray 102 out side 103 of the chassis 101 to replace a cooling device, e.g., cooling device 106B. A cooling device may, for example, be replaced when a failure occurs. In FIG. 3, cooling device tray 102 and 104 are some distance d2 apart, at which point the linkage 107 between cooling device tray 102 and cooling device tray 104 has engaged such that cooling device tray 104 now translates along with cooling device tray 102. Pivot member 108D has also began to contact member 118. Because the pivot member 108D is movably mounted to cooling device tray 104, the contact with member 118 may rotate pivot member 108D about the pivot axis of pivot post 110D. The amount of rotation of cooling device 106D may increase as cooling device tray 104 translates closer to the center of chassis 101.

Figure 5:
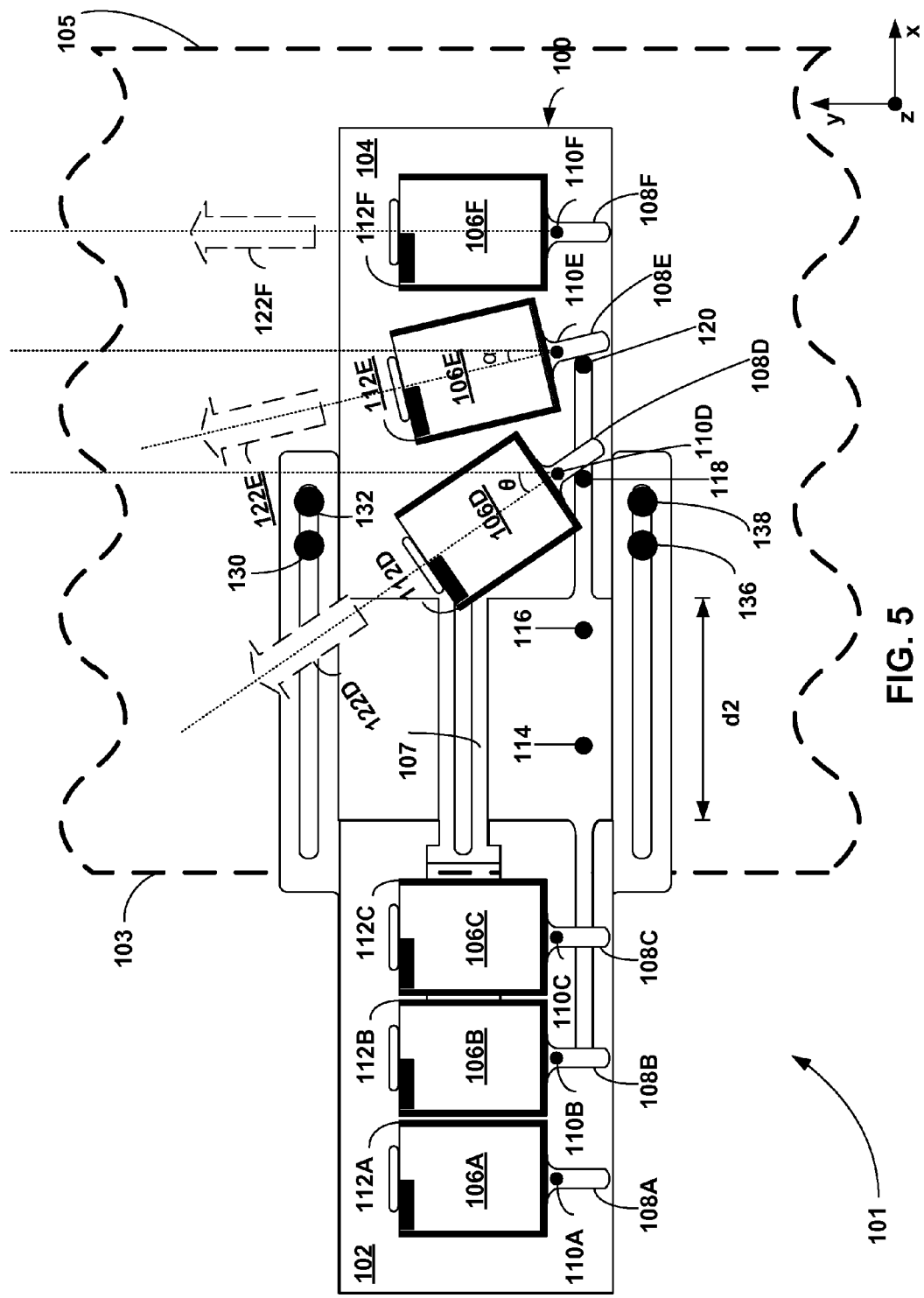
FIG. 5 illustrates a top view of the installed cooling apparatus after the removed cooling device tray is in a swap position, according to some embodiments.

FIG. 5 illustrates cooling apparatus 100 after cooling device tray 104 is in a swap position, according to some embodiments. The swap position, as referred to herein, may include a position in which cooling device tray 102 is outside the chassis 101 and a cooling device, e.g., cooling device 106B, is capable of being replaced. Additionally, in the swap position, cooling devices 106D-106F may be oriented to cool electronic components such that fluid streams 122D-122F are distributed across the electronic components to fill the void from removing cooling device tray 102 and its cooling devices from the chassis 101. Cooling devices 106 may rotate some amount, and the angle of rotation of the cooling devices 106 may depend on the size of the chassis 101. An angle of rotation, as used herein, may refer to the angle between the cooling devices 106 and the normal operating position. This is depicted, for example, with the angle θ shown at cooling device 106D and the angle α shown at cooling device 106E. Cooling device 106F may also be capable of rotating, but has not rotated in FIG. 4. In such an embodiment, cooling device 106F may have an angle of rotation β (not shown in FIG. 4). The angles of rotation of the cooling devices 106D-106F may be such that the fluid flows are dispersed and the electronic components receive some portion of the fluid streams 122D-122F when cooling device tray 102 is outside of the chassis 101. To accomplish this, the cooling devices 106D-106F may have respective different angles of rotation. Cooling device 106D may have the largest angle of rotation, cooling device 106E may have the next largest angle of rotation, and cooling device 106F may have a zero-degree angle of rotation, according to some embodiments.

Figure 6:
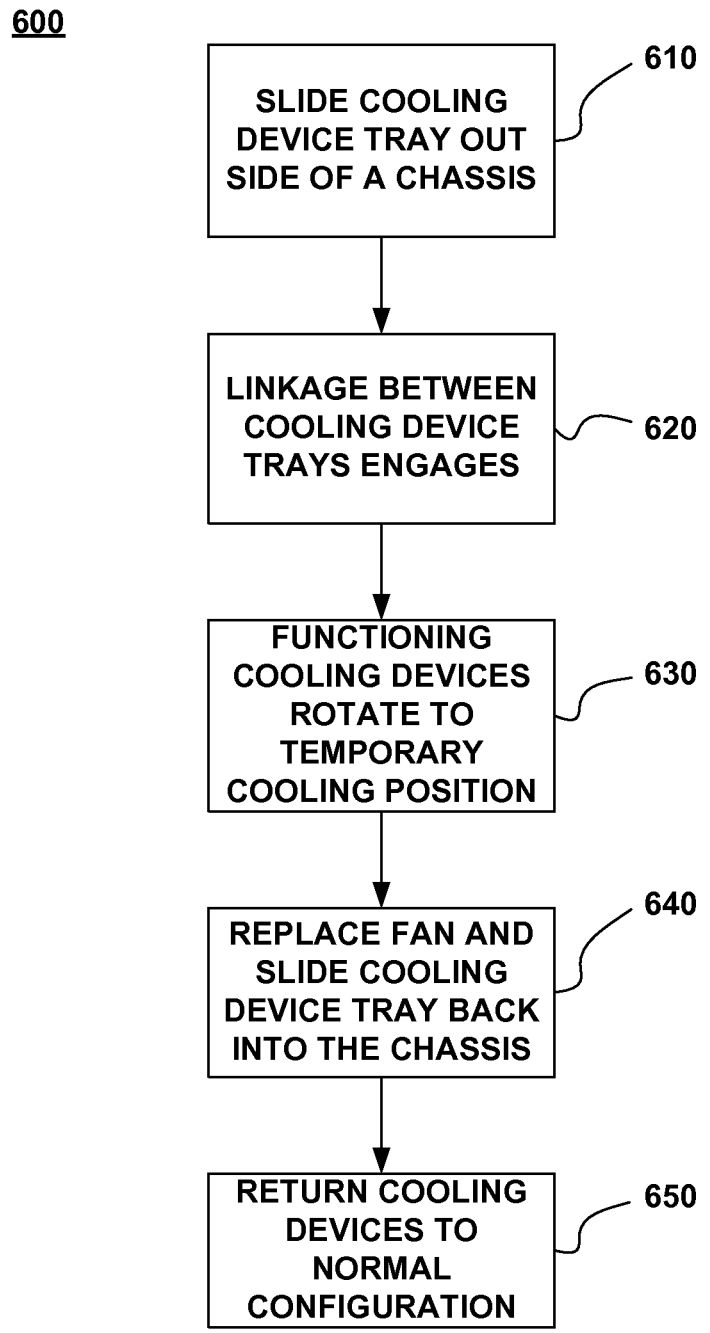
FIG. 6 is a flowchart that illustrates a method providing for the rotation of a cooling device due to sliding of a cooling device tray during removal and replacement of a cooling device, according to some embodiments.

FIG. 6 illustrates an operation 600 to remove and replace a cooling device, e.g., cooling devices 106, in cooling apparatus 100, according to some embodiments. When a cooling device fails, e.g., cooling device 106B, the output of the remaining functional cooling devices may be ramped to an output between their normal and maximum output. This may increase the audible volume of the cooling devices to notify an operator that a cooling device has failed. This may also help cool the electronic components to prevent overheating. An operator may remove and replace a cooling device, such as upon a cooling device failure, while the remaining cooling devices are operating, i.e., hot-swap the failed cooling device.

At operation 610, an operator may slide a cooling device tray, e.g., cooling device tray 102, out the side of a chassis, e.g., chassis 101. In some embodiments, the cooling device tray, e.g., cooling device tray 102, carrying the cooling device to be replaced may be configured such that the cooling devices become unplugged and therefore power down as part of this sliding process. In operation 620, when a cooling device tray, e.g., cooling device tray 102, has translated a distance d2 (FIG. 4) a linkage 107 may be engaged such that a second cooling device tray, e.g., cooling device tray 104, may begin to translate along with the first cooling device tray. At operation 630, a pivot member of a cooling device cradle, e.g., cooling device cradles 112, may contact a member, e.g., member 118, within a chassis, e.g., chassis 101, and begin to rotate. The force of the member, e.g., member 118, contacting the cooling device cradle's pivot member, e.g., pivot member 108D, may rotate the cooling device about its pivot axis. This rotation may direct the fluid stream of the cooling device to a different area of the chassis while the operator is replacing a cooling device.

At operation 640, an operator may have replaced the cooling device and be sliding the cooling device tray with operational cooling devices back into chassis 101. When the cooling device tray comes into contact with the second cooling device tray, the second cooling device tray may be pushed toward its normal operating configuration. Because the force applied by the member, e.g., member 118, to the pivot member, e.g., pivot member 108D, is decreasing, a rotation mechanism that is part of the pivot post, e.g., pivot post 110D, the pivot member may rotate the cooling device back toward its normal operating configuration. In some embodiments, the cooling devices, e.g., cooling devices 106A-106C, may be configured such that they are powered and operational prior to reaching the normal operating configuration. At operation 650, the cooling device trays may have reached the normal operating configuration. In some embodiments, the cooling devices may return to their normal operating output when the cooling devices are in the normal operating configuration and are all operating.

The descriptions of the various embodiments have been presented for purposes of illustration and are not intended to be exhaustive or limited to the embodiments disclosed, nor are they intended to limit the scope of the invention as claimed in the appended claims. Many modifications and variations will be apparent to those of ordinary skill in the art without departing from the scope and spirit of the described embodiments. The terminology used herein was chosen to best explain the principles of the embodiments, the practical application of technical improvement over technologies found in the marketplace, or to enable others of ordinary skill in the art to understand the embodiments disclosed herein.

The invention claimed is:

1. A cooling apparatus for cooling electronic devices within an information technology system, comprising:
   a first slidably mounted cooling device tray including a first cooling device movably mounted to the first cooling device tray, the first cooling device having a first pivot member configured to pivot the first cooling device when in contact with a first fixed member;
   a second slidably mounted cooling device tray including a second cooling device movably mounted to the second cooling device tray, the second cooling device having a second pivot member configured to pivot the second cooling device when in contact with a second fixed member; and
   a linkage between the first cooling device tray and the second cooling device tray configured to move the first cooling device tray when the second cooling device tray moves, thereby rotating the first cooling device.

2. The cooling apparatus of claim 1, wherein the linkage between the first cooling device tray and the second cooling device tray is configured to move the second cooling device tray when the first cooling device tray moves, thereby rotating the second cooling device.

3. The cooling apparatus of claim 1, wherein the first pivot member of the first cooling device includes a first rotation mechanism configured to orient the first cooling device in a first direction.

4. The cooling apparatus of claim 3, wherein the first rotation mechanism includes a spring.

5. The cooling apparatus of claim 1, wherein the second pivot member of the second cooling device includes a second rotation mechanism configured to orient the second cooling device in a second direction.

6. The cooling apparatus of claim 5, wherein the second rotation mechanism includes a spring.

7. The cooling apparatus of claim 1, wherein the first cooling device tray includes a plurality of cooling devices, the plurality of cooling devices having respective different angles of rotation.

8. The cooling apparatus of claim 1, wherein the second cooling device tray includes a plurality of cooling devices, the plurality of cooling devices having respective different angles of rotation.

9. A method to redirect a cooling device upon removal of a cooling device from an information technology system, comprising:
   linking a first cooling device tray to a second cooling device tray;
   moving a second cooling device tray as the first cooling device tray moves, wherein the first cooling device tray includes a first cooling device and the second cooling device tray includes a second cooling device;
   directing a fluid flow from the second cooling device in a swap position such that the fluid flow is dispersed across a chassis, wherein the second cooling device is movably mounted to the second cooling device tray; and
   redirecting the fluid flow from the second cooling device to a normal operating configuration.

10. The method of claim 9, wherein the first cooling device includes a plurality of cooling devices, a first of the plurality of cooling devices has a first angle of rotation and a second of the plurality of cooling devices has a second angle of rotation.

11. The method of claim 9, wherein the first cooling device includes a plurality of cooling devices, a first of the plurality of cooling devices has a first angle of rotation and a second of the plurality of cooling devices has a second angle of rotation.

12. A cooling apparatus for cooling electronic devices within an information technology system, comprising:
   a first slidably mounted cooling device tray including a first cooling device cradle movably mounted to the first cooling device tray, the first cooling device cradle having a first pivot member configured to pivot the first cooling device cradle when in contact with a first fixed member;
   a second slidably mounted cooling device tray including a second cooling device cradle movably mounted to the second cooling device tray, the second cooling device cradle having a second pivot member configured to pivot the second cooling device cradle when in contact with a second fixed member; and
   a linkage between the first cooling device tray and the second cooling device tray configured to move the first cooling device tray when the second cooling device tray moves, thereby rotating the first cooling device cradle.

13. The cooling apparatus of claim 12, wherein the linkage between the first cooling device tray and the second cooling device tray is configured to move the second cooling device tray when the first cooling device tray moves, thereby rotating the second cooling device cradle.

14. The cooling apparatus of claim 12, wherein the first pivot member of the first cooling device cradle includes a first rotation mechanism configured to orient the first cooling device cradle in a first direction.

15. The cooling apparatus of claim 14, wherein the first rotation mechanism is a spring.

16. The cooling apparatus of claim 12, wherein the second pivot member of the second cooling device cradle includes a second rotation mechanism configured to orient the second cooling device cradle in a second direction.

17. The cooling apparatus of claim 12, wherein the first cooling device cradle includes a first cooling device.

18. The cooling apparatus of claim 12, wherein the second cooling device cradle includes a second cooling device.

19. The cooling apparatus of claim 12, wherein the first cooling device tray includes a plurality of cooling device cradles, the plurality of cooling device cradles having respective different angles of rotation.

20. The cooling apparatus of claim 12, wherein the second cooling device tray includes a plurality of cooling device cradles, the plurality of cooling device cradles having respective different angles of rotation.

* * * * *